United States Patent
Miteva et al.

(10) Patent No.: US 8,003,884 B2
(45) Date of Patent: Aug. 23, 2011

(54) PHOTOVOLTAIC DEVICE AND METHOD FOR PREPARING THE SAME

(75) Inventors: Tzenka Miteva, Stuttgart (DE); Gabriele Nelles, Stuttgart (DE); Akio Yasuda, Stuttgart (DE)

(73) Assignee: Sony Deutschland GmbH, Cologne (DE)

( * ) Notice: Subject to any disclaimer, the term of this patent is extended or adjusted under 35 U.S.C. 154(b) by 659 days.

(21) Appl. No.: 11/211,358

(22) Filed: Aug. 24, 2005

(65) Prior Publication Data

US 2007/0240761 A1   Oct. 18, 2007

Related U.S. Application Data

(63) Continuation-in-part of application No. 10/234,488, filed on Sep. 3, 2002, now abandoned.

(30) Foreign Application Priority Data

Sep. 4, 2001   (EP) .................................. 01121178

(51) Int. Cl.
*H01L 31/00* (2006.01)
(52) U.S. Cl. .......... 136/263; 136/256; 136/252; 438/47; 438/57; 438/63; 438/82; 438/94; 438/99; 257/10; 257/183; 257/184; 257/414; 257/431; 257/461
(58) Field of Classification Search .................. 136/263, 136/256, 252; 438/47, 57, 63, 82, 94, 99; 257/40, 183, 184, 414, 431, 461
See application file for complete search history.

(56) References Cited

U.S. PATENT DOCUMENTS

| | | | | |
|---|---|---|---|---|
| 3,925,171 A | * | 12/1975 | Jargon et al. | 205/319 |
| 4,532,372 A | | 7/1985 | Nath et al. | 136/256 |
| 4,556,816 A | | 12/1985 | Imamura et al. | 313/366 |
| 4,694,117 A | | 9/1987 | Friedrich et al. | 136/256 |
| 5,256,945 A | * | 10/1993 | Imai et al. | 313/504 |
| 5,652,067 A | * | 7/1997 | Ito et al. | 428/690 |
| 5,677,572 A | * | 10/1997 | Hung et al. | 257/750 |
| 5,723,877 A | * | 3/1998 | Sugawa et al. | 257/59 |
| 5,776,622 A | * | 7/1998 | Hung et al. | 428/690 |
| 5,886,075 A | * | 3/1999 | Keane et al. | 524/308 |
| 5,925,897 A | | 7/1999 | Oberman | 257/80 |
| 6,069,442 A | * | 5/2000 | Hung et al. | 313/504 |

(Continued)

FOREIGN PATENT DOCUMENTS

EP   1160888 A1 * 12/2001

(Continued)

OTHER PUBLICATIONS

"P-Type Semiconductor", Electrical Engineering Training Series, http://www.tpub.com/content/neets/14179/css/14179_50.htm, Accessed on Apr. 21, 2008, Available online since Aug. 2003.*

(Continued)

*Primary Examiner* — Alexa D Neckel
*Assistant Examiner* — Golam Mowla
(74) *Attorney, Agent, or Firm* — Oblon, Spivak, McClelland, Maier & Neustadt, L.L.P.

(57) ABSTRACT

The present invention relates to a photovoltaic device, especially hybrid solar cells, comprising at least one layer comprising evaporated fluoride and/or acetate; and to a method for preparing the same.

18 Claims, 4 Drawing Sheets

U.S. PATENT DOCUMENTS

| | | | |
|---|---|---|---|
| 6,198,092 B1 | 3/2001 | Bulovic et al. | 250/214.1 |
| 6,589,383 B1 * | 7/2003 | Takaoka et al. | 156/313 |
| 6,700,058 B2 | 3/2004 | Nelles et al. | 136/263 |
| 6,706,962 B2 | 3/2004 | Nelles et al. | 136/263 |
| 6,933,436 B2 * | 8/2005 | Shaheen et al. | 136/263 |
| 7,061,009 B2 * | 6/2006 | Nelles et al. | 257/40 |
| 2001/0032665 A1 | 10/2001 | Han et al. | 136/256 |
| 2002/0015881 A1 * | 2/2002 | Nakamura et al. | 429/111 |
| 2002/0036298 A1 | 3/2002 | Nelles et al. | 257/136 |
| 2002/0117201 A1 | 8/2002 | Nelles et al. | 136/263 |
| 2003/0067000 A1 | 4/2003 | Nelles et al. | 257/40 |
| 2004/0084080 A1 * | 5/2004 | Sager et al. | 136/263 |
| 2004/0094196 A1 * | 5/2004 | Shaheen et al. | 136/263 |

FOREIGN PATENT DOCUMENTS

| | | |
|---|---|---|
| JP | 7-307483 A | 11/1995 |
| JP | 2001-203377 A | 7/2001 |
| WO | WO 01/84645 A1 * | 11/2001 |

OTHER PUBLICATIONS

"Solar Cell", The American Solar Energy Society, http://www.rerc-vt.org/resources/glossary.htm, Accessed on Apr. 21, 2008, Available online since Nov. 2001.*

IBM Technical Disclosure Bulletin NN 79044691, vol. 21, No. 11, p. 4691, Apr. 1979.

The Random House College Dictionary, L. Urdang chief editor, pp. 648-649 (1973).

Coutts et al., "Hybrid Solar Cells Based on DC Magnetron Sputtered Films of n-ITO on APMOVPE Grown p-InP," $28^{th}$ IEEE Photovoltaic Specialists Conference, pp. 660-665, Sep. 1988.

Brabec et al., "Interpenetrating Networks of Fullerenes and Conjugated Polymers for Plastic Photovoltaics," $16^{th}$ European Photovoltaic Solar Energy Conference, May 2000, pp. 39-42.

Shaheen et al., "2.5% Efficient Organic Plastic Solar Cells," Applied Physics Letters, vol. 78, No. 6, pp. 841-843, Feb. 2001.

Machine English-language translation of JP 2001-203377 A, which published Jul. 2001.

* cited by examiner

PHOTOVOLTAIC DEVICE AND METHOD FOR PREPARING THE SAME

This Application is a Continuation-In-Part of abandoned U.S. patent application Ser. No. 10/234,488, filed on Sep. 03, 2002 now abandoned and entitled "Photovoltaic device and method for preparing the same", which claims priority of European Patent Application No. 01121178.6, filed on Sep. 04, 2001, the entirety of which is incorporated by reference herein.

The present invention relates to a photovoltaic device, especially a solar cell, and methods for the preparation of such devices.

Since the demonstration of crystalline silicon p/n junction solar cell in 1954 by Chapin et al with a reported efficiency of 6%, there was a dramatic increase in the efficiencies of such cells as a result of improvements in current, significant increase in voltage and splitting the sunlight among solar cells of different bandgaps. The higher voltages resulted directly from increasing the densities of minority carriers generated by absorbed sunlight. By reducing the minority carrier recombination rate, trapping light in active layers and by increasing the intensity of light with concentration optics, efficiencies as high as 25-30% have been reported for two band-gap single crystal laboratory cells like AlGaAs/GaAs. Thin film multijunction, multi-band-gap cells using hydrogenated amorphous silicon or polycrystalline alloys exhibit up to 15% laboratory efficiency. The efficiencies of commercial power systems in the field remain in the range of 3 to 12%.

As an alternative a dye sensitized semiconductor-electrolyte solar cell was developed by Grätzel et al consisting of titanium dioxide nanoparticles with a ruthenium complex adsorbed on the surface of an iodine-iodide electrolyte as disclosed in WO91/16719. The ruthenium complex acts as a sensitizer, which absorbs light and injects an electron into titanium dioxide; the dye is then regenerated by electron transfer from the iodine-iodide redox couple. The advantage of such a solar cell results from the fact that no crystalline semiconductors have to be used anymore while already providing conversion efficiencies of light into electrical energy of up to 12% (O'Reagan, B. et al; Nature (1991), 353, page 737).

However, replacement of the liquid electrolyte with solid charge transport material has been found important due to practical applications. Solid-state dye sensitized solar cells on nanoporous film of $TiO_2$ are a significant area of research for chemists, physicists and material scientists. These researches on solar cells became very important due to its low costs and the easiness of fabrication.

In the field of dye sensitized solid state solar cells, Hagen et al, Synethic Metals 89, 1997, 215, reports for the first time the concept of a new type of solid-state dye sensitized solar cell using organic hole transport material (HTM), which was further improved by Bach et al, Nature 398, 1998, 583, to obtain an overall conversion efficiency of 0.74%. The basic structure of the cell consists of a nanoporous $TiO_2$ layer coated on a conducting glass substrate, covered with a compact $TiO_2$ layer. Dye was absorbed by the nanoporous layer and the HTM along with dopant and salt was coated over the dye. The additives, salt and dopant (tris(4-bromophenyl)ammoniumyl hexachloroantimonate $(N(PhBr)_3SbCl_6)$ increased the efficiency.

A problem with organic devices having a solid conjugated semiconductor is that all interfaces are sources for energy potential losses, for example by introducing serial resistances. Lots of efforts are done to modify the interfaces, for example in solar cells. Desired effects of such modifications are to avoid diffusion of atoms from the back-electrode material into the layer system, to enhance charge carrier transfer or to block it, to fill pinholes to avoid undesired recombination, and to influence the workfunction of electrodes in the desired direction, etc.

A major factor limiting the energy conversion efficiencies in such devices is the low photovoltage, wherein charge recombination at the $TiO_2$-electrolyte interface plays a significant role.

Interface modifications that were done, e.g. in hybrid solar cells, are for example: $Nb_2O_5$ coating of $TiO_2$ porous layer to match the energy levels, as disclosed in Guo, P. et al., Thin Solid Films 351, 1999, 290; introducing the adsorption of benzoic acid derivatives to improve the charge injection in heterojunctions for dye sensitized solid state solar cells, as disclosed in Krüger et al., Advanced Materials 12, 2000, 447. Further, in Kelly et al., Langmuir 1999, 15, 7047 dye sensitized liquid solar cells with a cation-controlled interfacial charge injection are disclosed, proposing a model in which $Li^+$ adsorption stabilizes $TiO_2$ acceptor states resulting in energetically more favorable interfacial electron transfer. Huang et al., J. Phys. Chem. B 1997, 101, 2576 discloses dye sensitized liquid solar cells where the dye coated $TiO_2$ was treated with pyridine derivatives improving the efficiency remarkably, since recombination was blocked.

Small molecules like derivatives of benzoic acid or pyridine adsorb to $TiO_2$ and block the free interface, which results in a reduced recombination, as described above. However, these adsorption processes are wet-chemical processes that are not so easy to control, since physisorption might take place in addition to the desired chemisorption, which will give a thicker layer at the interface which might block the electron-transfer completely. A respective intermediate layer is most often introduced by spin-coating, drop-casting, self-assembly or electro deposition.

It is therefore an object of the present invention to overcome the drawbacks of the prior art, especially to provide a photovoltaic device having an increased stability compared to the respective devices known in the prior art and decreasing energy potential losses on interfaces between layers of such devices in a controllable manner.

A further object of the present invention is to provide a method for preparation of a device showing photovoltaic characteristic, more particularly of a device exhibiting the favorable characteristics as defined above.

The first object of the invention is solved by a hybrid photovoltaic device which is an organic-inorganic device comprising both organic and inorganic materials as active components, further comprising a solid conjugated semiconductor comprising a hole-transport material, which is a p-type semiconductor, said hybrid photovoltaic device further comprising at least one layer comprising evaporated fluoride and/or acetate, wherein said at least one layer is an evaporated layer, and wherein said at least one layer comprising evaporated fluoride and/or acetate is in direct contact with said p-type semiconductor.

A "direct contact" between said at least one layer comprising evaporated fluoride and/or acetate and said p-type semiconductor may be achieved in various ways: The fluoride/acetate may be evaporated on a blocking layer of said photovoltaic device and/or on a solid conjugated semiconductor layer, which preferably is nanoporous, and/or it may be evaporated on an electrode, preferably a back electrode of said device, and/or on the hole-transport material layer itself. Because the hole-transport material is in contact with any of these layers (blocking layer, solid conjugated nanoporous layer, back electrode), a layer of evaporated acetate and/or fluoride on any of these or on the HTM-layer itself will thus be in direct contact with said hole-transport material which is a p-type semiconductor.

In a preferred embodiment the evaporated fluoride is an alkali or alkaline earth metal fluoride.

In another preferred embodiment the evaporated acetate is an alkali metal acetate.

It is also preferred that the device further comprises a semiconductor oxide layer sensitized with a dye, preferably a ruthenium complex dye.

Further it is preferred that the evaporated layer containing fluoride and/or acetates is evaporated on top of the semiconductor oxide layer and/or on top of a layer of the hole transport material and/or on top of a transparent conductive electrode.

It is even more preferred that the semiconductor oxide layer is titanium dioxide.

In a further embodiment of the invention the evaporated layer has a thickness of about 0.5 to about 30 nm, preferably about 0.5 to about 15 nm.

Moreover, it is possible that fluorides and/or acetates evaporated on different layers of the device have different counter cations.

It is still preferred that the evaporated layer which is evaporated on the semiconductor oxide layer comprises lithium fluoride having a thickness of about 5 nm, and the evaporated layer which is evaporated on the hole transport material comprises cesium fluoride having a thickness of about 15 nm.

In another embodiment it is preferred that the hole transport material is represented by formula (I)

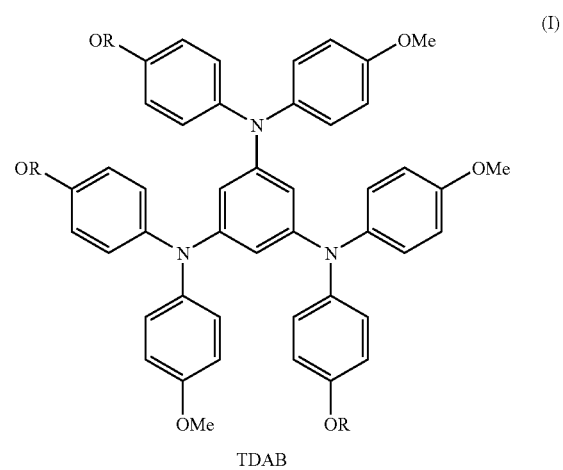

wherein R in each occurrence is dependently selected from hexyl and ethylhexyl within the wt % ratio of hexyl: ethylhexyl being about 40: about 60, or represented by formula (II)

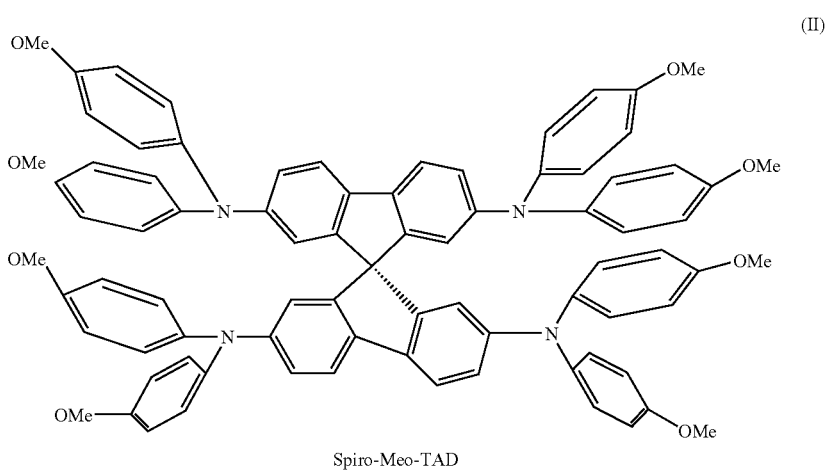

or represented by formula (III)

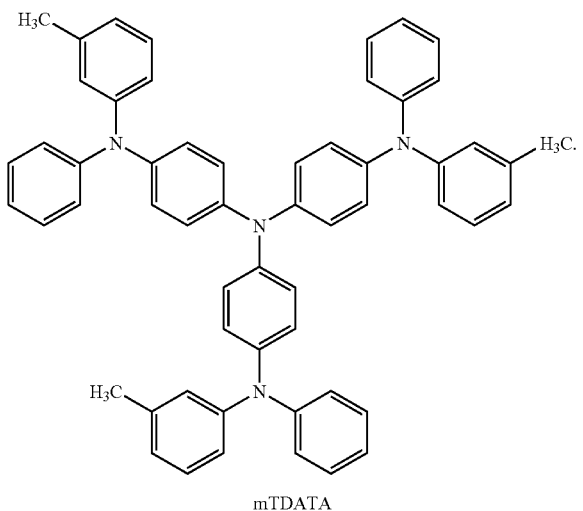

mTDATA

Further it is preferred that the semiconductor oxide layer is porous.

In another embodiment the semiconductor oxide layer comprises nanoparticles, preferably nanoparticles of $TiO_2$.

The second object of the invention is solved by a method for preparing a hybrid photovoltaic device according to the present invention having a solid conjugated semiconductor comprising a hole-transport material, which is a p-type semiconductor, said hybrid photovoltaic device being an organic-inorganic device comprising both organic and inorganic materials as active components, said method comprising evaporating at least one layer containing fluoride and/or acetate on at least one layer of the device, wherein said at least one layer containing fluoride and/or acetate is in direct contact with said p-type semiconductor.

The method preferably comprises the additional steps of:
(i) mixing the hole transport material with dopant;
(ii) applying the mixture to a semiconductor oxide layer; whereas these steps are preferably conducted before conducting the above mentioned step of
(iii) evaporating at least one layer containing fluoride and/or acetate on at least one layer of the photovoltaic device.

In a preferred embodiment at least one layer comprising fluoride and/or acetate is evaporated on top of a dye sensitized semiconductor oxide layer and/or on top of a layer of the hole transport material and/or on top of a transparent conductive electrode.

Also preferred is an embodiment, wherein the method further comprises at least one of the following steps:
providing a semiconductor oxide layer,
applying said mixture to said semiconductor oxide layer, and
connecting electrodes to said semiconductor oxide layer and to said mixture.

The object of the invention is also solved by a solar cell produced by the method according to the present invention and especially to a solar cell comprising an organic and/or polymer blend, and/or organic and/or polymeric semiconductor bilayer structure containing solar cells.

With respect to the organic and/or polymer blend, and/or organic and/or polymeric semiconductor bilayer structure containing solar cells it is especially referred to the patent application EP1 028 475 (application number 99102473.8-2214) of the same applicant and especially the structures described therein, as well as to Shaheen et al., Applied Physics Letters 78 (2001), 841, Brabec et al., Advanced Functional Materials, 11 (2001), 15 and Schmidt-Mende et al., Science 294 (2001), 5532.

It is preferred that the solar cell is an organic or polymeric solid state hybrid solar cell.

It was surprisingly found that devices according to the present invention show higher energy conversion efficiencies than the ones without fluoride and/or acetate layer. In particular, open circuit voltage $V_{OC}$ and fill factor FF were increased, which yield to the higher efficiency. Further, evaporation of an additional layer is a simpler technique than a wet-chemical process.

The use of efficient light emitting diodes with alkaline and alkaline earth metal fluoride Al cathode has been already disclosed, e.g. the first time by Hung et al., Applied Physical Letters, 70 (1997), 152, and by Yang et al., Applied Physical Letters 79, 2001, 563. Further disclosures may be found in, for example, Ganzorig et al., Materials Science and Engineering B85 (2000) 140, and Brown et al., Applied Physics Letters, 77 (2000) 3096.

The origin of the effect that devices having fluoride and/or acetate layers show increased efficiency might be explained, without being bonded to theory, by a better shielding of the $TiO_2$ from the hole transport material layer which reduces the recombination on one side. Applying the aligned dipole mechanism theory, the effect may be explained by an increased charge carrier density close to the interface but also inside the hole transport material due to dissociation and diffusion of the cations.

As was found by the inventors, various alkali or alkaline earth metal fluorides and alkali metal acetates, respectively, may be chosen in the device according to the present invention. It was found that lithium fluoride works better at the $TiO_2$/HTM interface and cesium fluoride at the HTM/Au interface, possibly because of the higher tendency for dissociation of cesium fluoride than of lithium fluoride.

Besides the hole transport materials already disclosed in the application, other compounds are as well suitable and may comprise linear as well as branched or starburst structures and polymers carrying long alkoxy groups as sidechains or in the backbone. Such hole transport materials are in principle disclosed in EP 0 901 175 A2, the disclosure of which is incorporated herein by reference. In general, the hole-transport materials (HTMs) according to the present invention are p-type semiconductors.

Further possible hole transport materials are, e.g. described in the WO 98/48433, DE 19704031.4 and DE 19735270.7. The latter two references disclose TDAB for application in organic LEDs. It is to be noted that any of the known TDAB may be—further-derivatized such as by using substitutions such as alkoxy, alkyl, silyl at the end-standing phenyl rings which could be in p-, m- and o-position mono-, bi-, or tri-substituted. As indicated already above the guidelines disclosed herein apply not only to single organic hole transport materials but also to mixtures thereof.

As dopant all agents may be used which are suitable to be used in organic devices and which are known to a person skilled in the art. A preferable dopant is, for example, oxidized hole transport material and doping agents disclosed in EP 111 493.3, the disclosure of which is incorporated herein by reference.

Dyes which can be used for sensitizing a semiconductor oxide layer are known in the art such as EP 0 887 817 A2 the disclosure of which is incorporated herein by reference. Among the dyes to be used are also Ru(II) dyes.

The dyes used to sensitize the semiconductor oxide layer may be attached thereto by chemisorption, adsorption or by any other suitable ways.

The semiconductor oxide layer used in the inventive device is preferably a nanoparticulate one. The material can be a metal oxide and more preferably an oxide of the transition metals or of the elements of the third main group, the fourth, fifth and sixth subgroup of the periodic system. These and any other suitable materials are known to those skilled in the art and are, e.g. disclosed in EP 0 333 641 A1, the disclosure of which is incorporated herein by reference.

The semiconductor oxide layer material may exhibit a porous structure. Due to this porosity the surface area is increased which allows for a bigger amount of sensitizing dye to be immobilized on the semiconductor oxide layer and thus for an increased performance of the device. Additionally, the rough surface allows the trapping of light which is reflected from the surface and directed to neighbouring surface which in turn increases the yield of the light.

The method for the manufacture of a photoelectric conversion device according to the present invention can exemplary be summarized as follows.

I. Structuring of TCO (Transparent Conductive Oxide Layer) Substrates
II. Cleaning of TCO Substrates
  a. Ultrasonic cleaning 15 minutes in an aqueous surfactant at ca. 70° C.
  b. Rinse thoroughly with ultrapure water and dry in air
  c. Ultrasonic rinsing with ultrapure water 15 min at ca. 70° C.
  d. Ultrasonic cleaning 15 minutes in pure isopropanol at ca. 70° C.
  e. Blow dry with nitrogen
III. Preparation of Blocking Layer
  a. Making polycrystalline $TiO_2$ by spray pyrolysis of titanium acetylacetonate solution;
  b. Temper film at 500° C.
IV. Preparation of Nanoporous $TiO_2$ Semiconductor Oxide Layer
  a. Screen printing: use a $TiO_2$ paste with a screen structured with the desired geometry (thickness depends on screen mesh); resulting standard thickness is about 3 μm; doctor blading is an alternative technique to make porous $TiO_2$ layer
  b. Sintering of film
    1. Heat the substrates up to 85° C. for 30 minutes to dry the film
    2. Sinter at 450° C. for ½ hour, ideally under oxygen flow, otherwise in air
    3. Let sample cool down slowly to avoid cracking
V. Dyeing of Nanocrystalline $TiO_2$ Film
  a. Prepare a solution of dye in ethanol, concentration ca. $5 \times 10^{-4}$ M
  b. Put the ca. 80° C. warm substrates into the dye solution.
  c. Let them sit in the dye-solution at room temperature in the dark for about 8 hours or overnight.
  d. Remove from dye solution, rinse with ethanol and let dry several hours or overnight in the dark.
VI. Evaporating LiF (ca. 5 nm).
VII. Deposition of Hole Transport Material (HTM)
  a. Prepare a solution of HTM. Current "standard conditions" are:
    Solvent: chlorobenzene (plus ca. 10% acetonitrile from dopant solution)
    HTM: concentration (5-60 mg/substrate)
    Dopant: oxidized HTM (ca. 0,2 mol % of hole conductor concentration, to be added from a solution in acetonitrile)
    Salt: $Li((CF_3SO_2)_2N)$, (ca. 9 mol %)
  b. Spin-coat the solution onto the film using the following parameters
  c. Let the samples dry at least several hours in air or preferably overnight
VIII. Evaporating CsF (ca. 15 nm).
IX. Deposition of Counterelectrode
  a. Evaporate the counterelectrode on top (currently Au)

As is understood changes may be done in that method without departing from the scope of protection.

The invention is now further illustrated by the accompanying figures from which further embodiments, features and advantages may be taken and where

BRIEF DESCRIPTION OF THE DRAWINGS

As shown in FIG. 1 a solar cell according to the present invention is built of a substrate, followed by a FTO layer, a blocking $TiO_2$ layer, dye-sensitized $TiO_2$ with a fluoride layer, hole transport material (HTM), a second fluoride layer, and a gold (Au) layer.

Figure 1:
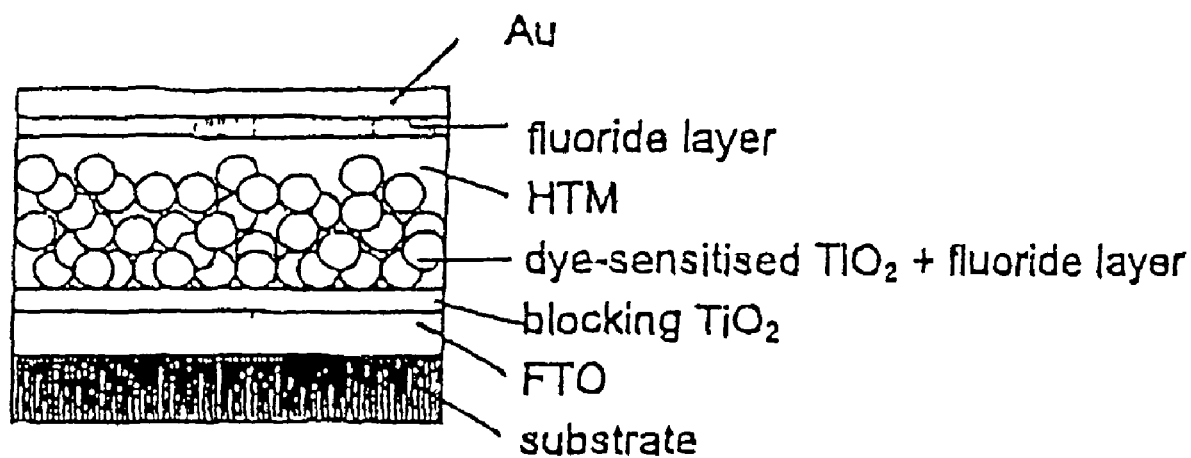
FIG. 1 shows an embodiment of a basic design of an inventive photovoltaic device, namely the hybrid solar cell, described above.
Figure 2:
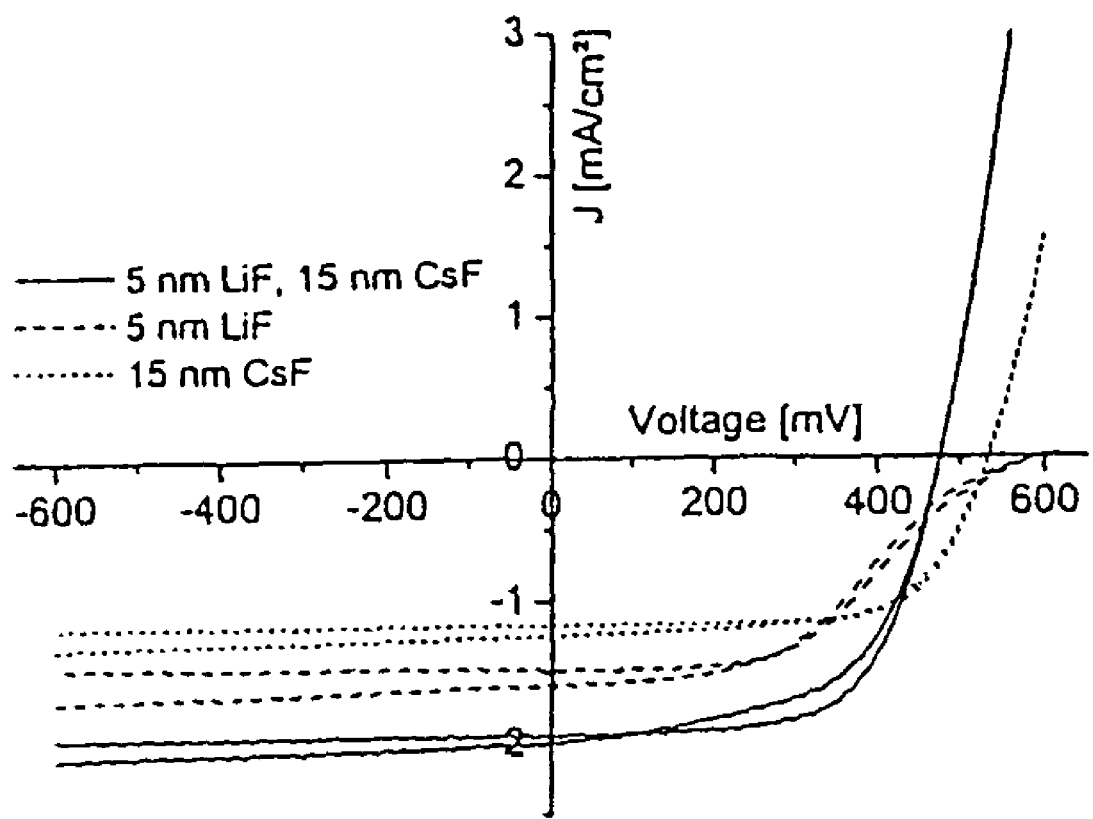
FIG. 2 shows the I/V curve of the first type of solar cell according to the present invention and having 5 nm LiF at $TiO_2$/dye interface and 15 nm CsF at HTM/back electrode interface evaporated.

To demonstrate the improved efficiency of an inventive device having the features of claim 1 of the present invention, particularly an evaporated layer of 5 nm LiF at $TiO_2$/dye interface and an evaporated layer of 15 nm CsF at HTM/back-electrode interface, respectively, the I/V curve for that device is shown in FIG. 2. The parameters according to this curve are listed in table 1.

TABLE 1

|  | $J_{SC}[mA/cm^2]$ | $V_{OC}[mV]$ | FF [%] | η [%] |
|---|---|---|---|---|
| CsF (15 nm)/Au | 1.25 | 535 | 65 | 0.7 |
| $TiO_2$/LiF (5 nm) | 1.52 | 562 | 43 | 0.6 |
| $TiO_2$/LiF (5 nm)// CsF (15 nm)/Au | 1.99 | 476 | 64 | 1.0 |

As a result, the combination of LiF and CsF yields to an efficiency of 1% at 100 mW/cm².

Figure 3:
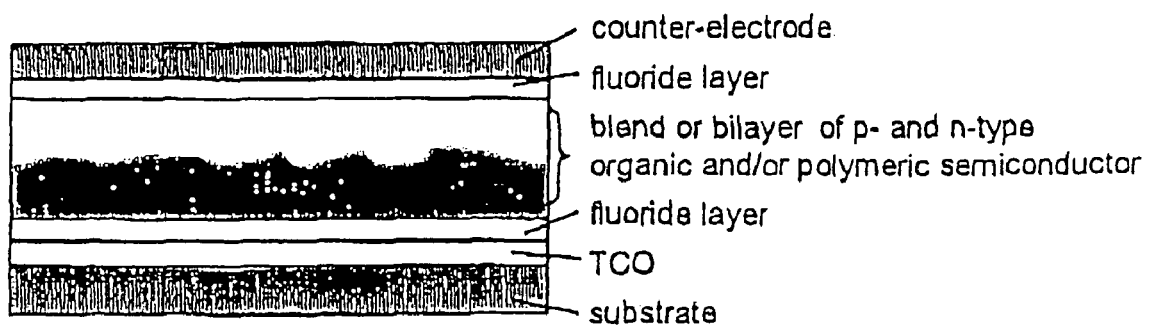
FIG. 3 shows an embodiment of a basic design of an inventive photovoltaic device, comprising an organic and/or polymer blend, and/or organic and/or polymeric semiconductor bilayer structure.

FIG. 3 shows an embodiment of a basic design of an inventive photovoltaic device, comprising a substrate, a TCO-layer, a counter-electrode, especially an Al electrode as well as two fluoride layers, enclosing a blend or bilayer of p- or n-type organic/or polymeric semiconductors.

Figure 4:
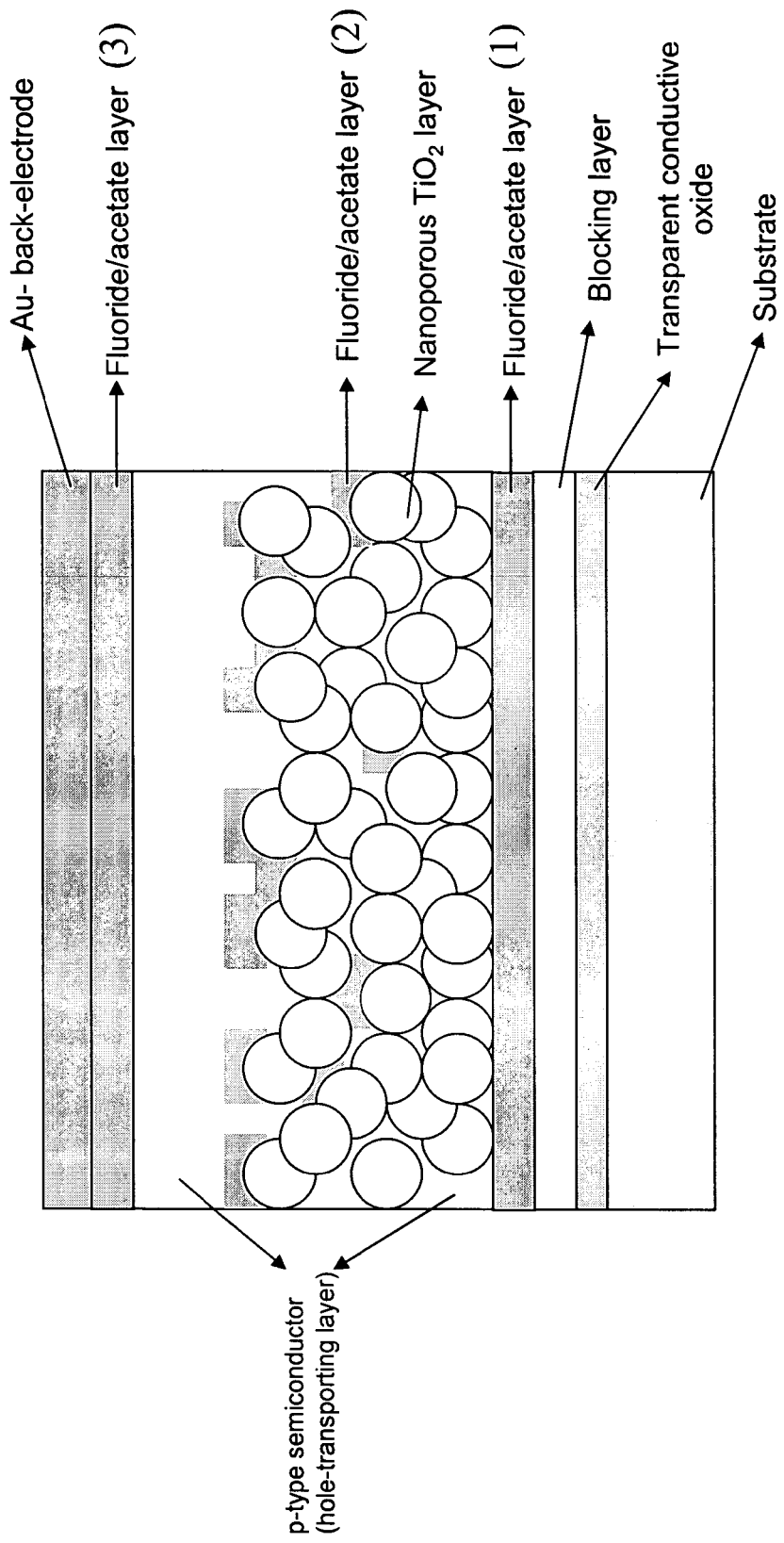
FIG. 4 shows an embodiment of a basic design of an inventive photovoltaic device wherein the evaporated fluoride/acetate layer is in direct contact with the p-type semiconductor (hole-transport layer).

FIG. 4 shows an embodiment of a basic design of an inventive photovoltaic device wherein the evaporated fluoride/acetate layer is in direct contact with the p-type semiconductor (hole-transport layer). It should be noted that the evaporated fluoride/acetate layer according to the present invention may be an evaporated layer on top of a blocking layer (in which case the evaporated layer is the fluoride/acetate layer (1) of FIG. 4) and/or on top of a solid conjugated semiconductor layer, e.g. TiO$_2$ layer, (in which case the evaporated layer is the fluoride/acetate (2) of FIG. 4) and/or on top of a hole-transporting material layer (in which case the evaporated layer is the fluoride/acetate layer (3) of FIG. 4) and/or on top of a conductive electrode, e.g. back electrode (in which case the evaporated layer is the fluoride/acetate layer (3) of FIG. 4) of a photovoltaic device according to the present invention. Because the hole-transporting material (p-type semiconductor) has an interface with all of these layers, an acetate/fluoride layer that has been evaporated onto any of these or any combination thereof will thus be in direct contact with said p-type semiconductor.

The features of the present invention disclosed in the description, the claims and/or the drawings may both separately and in any combination thereof be material for realizing the invention in various forms thereof.

The invention claimed is:
1. A photovoltaic device comprising
a transparent conductive oxide electrode,
a blocking layer on the transparent conductive oxide electrode,
a semiconductor oxide layer sensitized with a dye on the blocking layer,
a layer of a solid conjugated semiconductor as a hole transport material on the sensitized semiconductor oxide layer,
a layer comprising lithium fluoride between the sensitized semiconductor oxide layer and the hole transport material layer, and
a counter electrode on the hole transport material layer,
wherein the photovoltaic device has a layer comprising cesium fluoride between the hole transport material layer and the counter electrode.

2. The photovoltaic device according to claim 1, wherein the layer between the hole transport material layer and the counter electrode comprising cesium fluoride has a thickness of about 15 nm.

3. The photovoltaic device according to claim 1, further comprising an additional layer comprising lithium fluoride having a thickness of about 5 nm on the semiconductor oxide layer.

4. The photovoltaic device according to claim 1, wherein the hole transport material is mixed with a dopant.

5. The photovoltaic device according to claim 1, further comprising a blend or bilayer structure of conductive organic and/or polymer materials, wherein one component is a p-type conductor and the other one is a n-type conductor.

6. The photovoltaic device according to claim 1, wherein the semiconductor oxide layer is titanium dioxide.

7. The photovoltaic device according to claim 1, wherein the hole transport material is represented by formula (I):

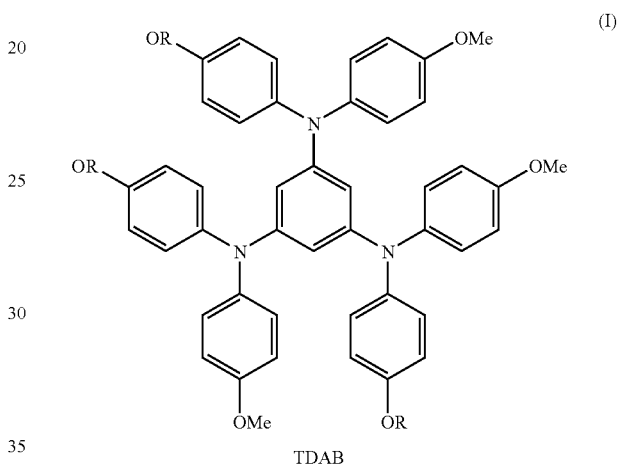

TDAB wherein R in each occurrence is dependently selected from hexyl and ethylhexyl within the wt% ratio of hexyl:ethylhexyl being about 40: about 60, or represented by formula (II):

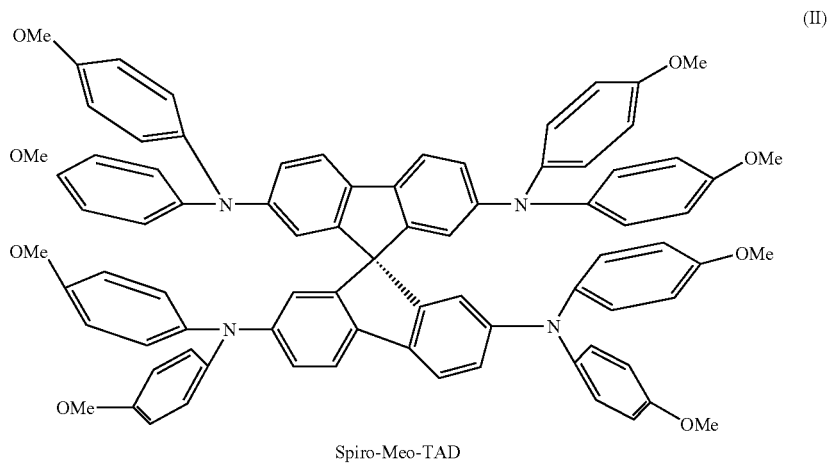

Spiro-Meo-TAD or represented by formula (III):

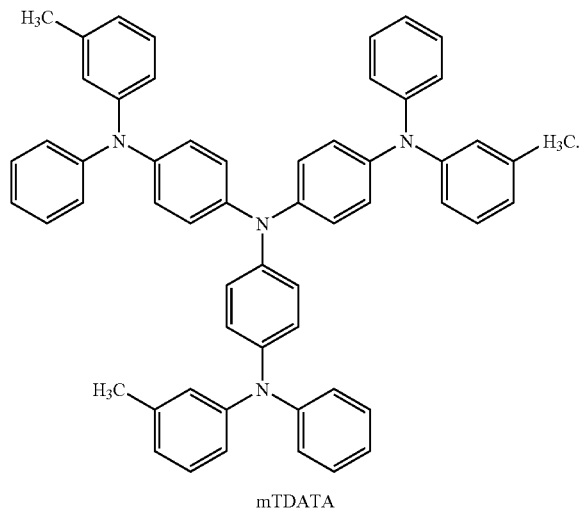

mTDATA

8. The photovoltaic device according to claim 1, wherein the semiconductor oxide layer is porous.

9. The photovoltaic device according to claim 8, wherein the semiconductor oxide layer comprises nanoparticles.

10. The photovoltaic device according to claim 1, wherein said hybrid photovoltaic device is a hybrid solar cell.

11. The hybrid solar cell according to claim 10, wherein the hybrid solar cell is a solid state hybrid solar cell.

12. The photovoltaic device according to claim 1, wherein said dye is a ruthenium complex dye.

13. The photovoltaic device according to claim 1, wherein an additional layer of fluoride and/or acetate is evaporated on top of the transparent conductive oxide electrode.

14. The photovoltaic device according to claim 9, wherein the semiconductor oxide layer comprises nanoparticles of $TiO_2$.

15. The photovoltaic device according to claim 4, further comprising a blend or bilayer structure of conductive organic and/or polymer materials, wherein one component is a p-type conductor and the other one is a n-type conductor and wherein the semiconductor oxide layer is porous and comprises nanoparticles.

16. A method for preparing a photovoltaic device of claim 1, wherein the layer comprising cesium fluoride is evaporated between the hole transport material and the counter electrode.

17. The method according to claim 16, further comprising
(i) mixing the hole transport material with a dopant to form a mixture; and
(ii) applying the mixture to the semiconductor oxide layer.

18. The method according to claim 17, further comprising at least one of the following:
providing the semiconductor oxide layer;
applying said mixture to said semiconductor oxide layer; and
connecting electrodes to said semiconductor oxide layer and to said mixture.

* * * * *